(12) United States Patent
Tsutsumi et al.

(10) Patent No.: US 8,269,580 B2
(45) Date of Patent: Sep. 18, 2012

(54) COMMUNICATION MODULE

(75) Inventors: Jun Tsutsumi, Kawasaki (JP); Kazuhiro Matsumoto, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 284 days.

(21) Appl. No.: 12/712,118

(22) Filed: Feb. 24, 2010

(65) Prior Publication Data

US 2010/0271154 A1    Oct. 28, 2010

(30) Foreign Application Priority Data

Apr. 22, 2009   (JP) ................................ 2009-104031

(51) Int. Cl.
*H01P 1/203* (2006.01)

(52) U.S. Cl. ......... 333/202; 333/204; 361/748; 174/258

(58) Field of Classification Search .................. 257/499, 257/503, 506, 508; 174/250–262; 361/777, 361/748; 333/204, 202
See application file for complete search history.

(56) References Cited

U.S. PATENT DOCUMENTS

| | | | | |
|---|---|---|---|---|
| 5,397,769 A * | 3/1995 | Higaki et al. | ................. | 505/210 |
| 5,512,539 A * | 4/1996 | Matsuura et al. | ............. | 505/210 |
| 6,797,890 B2 * | 9/2004 | Okubora et al. | ............. | 174/260 |
| 6,917,259 B2 * | 7/2005 | Hirabayashi | .................. | 333/105 |
| 7,420,438 B2 | 9/2008 | Nakai et al. | | |
| 7,477,118 B2 | 1/2009 | Ikuta et al. | | |
| 7,599,190 B2 * | 10/2009 | Okubora | ....................... | 361/760 |
| 2004/0130877 A1 * | 7/2004 | Okubora | ....................... | 361/793 |
| 2006/0192632 A1 | 8/2006 | Nakai et al. | | |
| 2007/0069834 A1 | 3/2007 | Ikuta et al. | | |
| 2008/0314629 A1 * | 12/2008 | Yang et al. | ..................... | 174/258 |
| 2009/0206956 A1 | 8/2009 | Tsutsumi et al. | | |

FOREIGN PATENT DOCUMENTS

| | | |
|---|---|---|
| EP | 1601112 A1 | 11/2005 |
| EP | 2093828 A1 | 8/2009 |
| JP | 2184096 A | 7/1990 |
| JP | 2004-128799 A | 4/2004 |
| JP | 2004-260737 A | 9/2004 |
| JP | 2004-266361 A | 9/2004 |
| JP | 2005-39263 A | 2/2005 |
| JP | 2005-136887 A | 5/2005 |
| JP | 2006-229213 A | 8/2006 |
| JP | 2006-319512 A | 11/2006 |
| JP | 2008-271421 A | 11/2008 |
| JP | 2009-200715 A | 9/2009 |

* cited by examiner

*Primary Examiner* — Angel R Estrada
*Assistant Examiner* — Dimary Lopez
(74) *Attorney, Agent, or Firm* — Chen Yoshimura LLP (57) ABSTRACT

A communication module includes a filter element, a package substrate on which the filter element is mounted, and a module substrate on which the package substrate is mounted. Each of the package substrate and the module substrate is formed of a laminate of a plurality of metal layers and a plurality of insulation layers. An outermost insulation layer forming a mounting surface of the package substrate that is a surface on which the filter element is mounted has a thickness smaller than a thickness of at least one of the other insulation layers included in the package substrate. An outer insulation layer forming a mounting surface of the module substrate that is a surface on which the package substrate is mounted has a thickness smaller than a thickness of at least one of the other insulation layers included in the module substrate.

6 Claims, 12 Drawing Sheets

COMMUNICATION MODULE

CROSS-REFERENCE TO RELATED APPLICATION

This application is based upon and claims the benefit of priority of the prior Japanese Patent Application No. 2009-104031 filed on 22 Apr. 2009, the entire contents of which is incorporated herein by reference.

FIELD

The disclosure of the present application relates to a communication module.

BACKGROUND

In recent years, radio communication equipment typified by portable telephone terminals have been increasingly modified into multiband systems, so that a plurality of pieces of radio equipment are incorporated in one telephone equipment. Demands for smaller-size and thinner portable telephone equipment, however, have been posed continuously, leading to strong demands for the downsizing and thinning of components incorporated therein. Demands for reducing costs of radio communication equipment also are strong, and in many cases, the downsizing and mounting cost reduction are achieved by combining some of incorporated components into one module.

Among the incorporated components of radio communication equipment, acoustic wave filters and duplexers using the same have difficulties in being integrated in other semiconductor components. Therefore, they have been mounted separately from semiconductor components. Recently, the number of filters and duplexers incorporated in one portable telephone terminal has increased rapidly owing to its multiband configuration, and therefore, demands for combining the filters and duplexers into modules, respectively, have increased. Further, there are also demands for the further downsizing and thinning of such modules.

Against such a backdrop, a module in which a plurality of acoustic wave filters and duplexers using the same are installed has been developed actively.

Here, in order to develop a small-size module, it is preferable to arrange individual filters and duplexers as closely to one another as possible when mounting them on a module substrate. Besides, it is preferable to arrange electric lines in the module substrate closely to one another. Still further, since acoustic wave filters and duplexers themselves are preferably downsized as a matter of course, it is also preferable to closely arrange electric lines in a package for housing acoustic wave filter elements. Still further, JP 2008-271421 A discloses an acoustic wave filter in which a filter element is mounted on a multilayer substrate for the downsizing.

When electric lines in an acoustic wave filter are arranged closely, unnecessary electromagnetic coupling tends to occur between the electric lines. Further, when electric lines in a module substrate are arranged closely, unnecessary electromagnetic coupling tends to occur between the electric lines. When unnecessary electromagnetic coupling occurs between electric lines, the suppression by the filter or the isolation by the duplexer tends to degrade easily.

SUMMARY

A communication module disclosed in the present application includes: a filter element; a package substrate on which the filter element is mounted; and a module substrate on which the package substrate is mounted, wherein each of the package substrate and the module substrate is formed of a laminate of a plurality of metal layers and a plurality of insulation layers, wherein an outermost insulation layer forming a mounting surface of the package substrate that is a surface on which the filter element is mounted has a thickness smaller than a thickness of at least one of the other insulation layers included in the package substrate, and an outer insulation layer forming a mounting surface of the module substrate that is a surface on which the package substrate is mounted has a thickness smaller than a thickness of at least one of the other insulation layers included in the module substrate.

Additional objects and advantages of the invention (embodiment) will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF EMBODIMENT(S)

The communication module is preferably modified so that a ground pattern is provided on a back face of the package substrate, the back face being opposite to the mounting surface of the outer insulation layer of the package substrate. This configuration allows electric fields generated in the vicinities of electric lines provided on the outer insulation layer to be preferentially led to a ground, thereby making it possible to reduce unnecessary electromagnetic coupling. Therefore, the suppression characteristics and the isolation characteristics can be improved.

The communication module is preferably modified so that a ground pattern is provided on a back face of the module substrate, the back face being opposite to the mounting surface of the outer insulation layer of the module substrate. This configuration allows electric fields generated in the vicinities of electric lines provided on the outer insulation layer to be preferentially led to a ground, thereby making it possible to reduce unnecessary electromagnetic coupling. Therefore, the suppression characteristics and the isolation characteristics can be improved.

In the communication module, preferably, the outer insulation layer of the package substrate has a relative dielectric constant smaller than, or identical to, a relative dielectric constant of another insulation layer included in the package substrate. This configuration makes it possible to reduce an increase in a capacity caused by a decrease in a distance between electric lines on the outer layer and a ground in the package, whereby excellent characteristics can be achieved.

In the communication module, preferably, the outer insulation layer of the module substrate has a relative dielectric constant smaller than, or identical to, a relative dielectric constant of another insulation layer included in the module substrate. This configuration makes it possible to reduce an increase in a capacity caused by a decrease in a distance between electric lines on the outer layer and a ground in the module, whereby excellent characteristics can be achieved.

Embodiment

1. Basic Configuration of Communication Module

The disclosure of the present application relates to a communication module used in mobile communication equipment or radio equipment typified by portable telephones. Particularly, the disclosure relates to a filter bank and a duplexer module in which an acoustic wave filter element is employed.

Causes of degradation of suppression characteristics and isolation performance of a small-size module in which an acoustic wave filter element or a duplexer is incorporated are electromagnetic coupling occurring to closely arranged electric lines in a package incorporating an elastic filter element, and electromagnetic coupling occurring to closely arranged electric lines in a module substrate. Therefore, a key to improve suppression characteristics and isolation performance in a small-size module is to reduce the above-described electromagnetic coupling occurring to closely arranged electric lines.

Figure 1A:
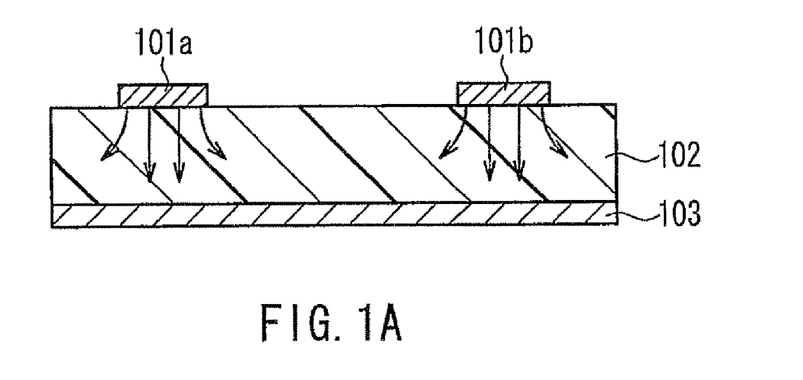
FIG. 1A is a cross-sectional view of a substrate on which electric lines are distanced substantially from each other.
Figure 1B:
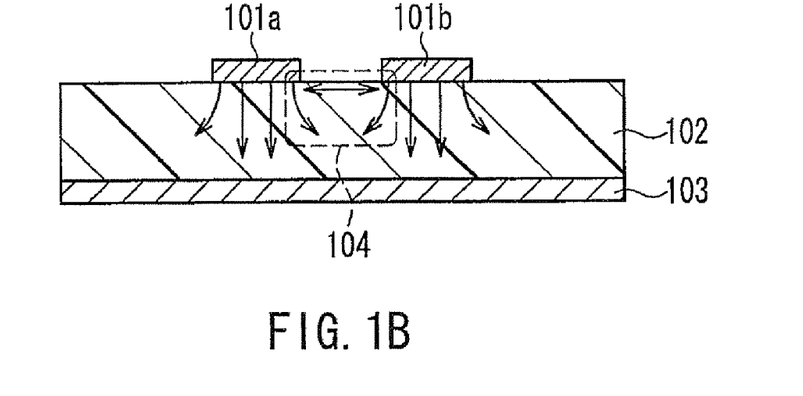
FIG. 1B is a cross-sectional view of a substrate on which electric lines are provided close to each other.

FIGS. 1A and 1B are cross-sectional views of an insulation substrate having, on its surface, electric lines 101*a* and 101*b*, each of which is made of a microstrip line. On a back face of the insulation substrate 102, a ground layer 103 is provided. Arrows in the drawings indicate electric fields generated from the electric lines 101*a* and 101*b*. First, when a space between the electric lines 101*a* and 101*b* is sufficiently large as illustrated in FIG. 1A, substantially no electric field is generated in the space between the electric lines, and electric fields are localized between the ground layer 103 and each of the electric lines 101*a* and 101*b*. In contrast, when the electric lines 101*a* and 101*b* are arranged closely as illustrated in FIG. 1B, electric fields are generated between the ground layer 103 and each of the electric lines 101*a* and 101*b*, as well as between the electric line 101*a* and the electric line 101*b* (dotted-line frame 104). The electric fields generated at the electric lines 101*a* and 101*b* are electromagnetically and electro-statically coupled between the electric lines, thereby degrading the suppression characteristics of the acoustic wave filter element provided with microstrip lines as illustrated in FIG. 1B or isolation characteristics of a duplexer.

Figure 2A:
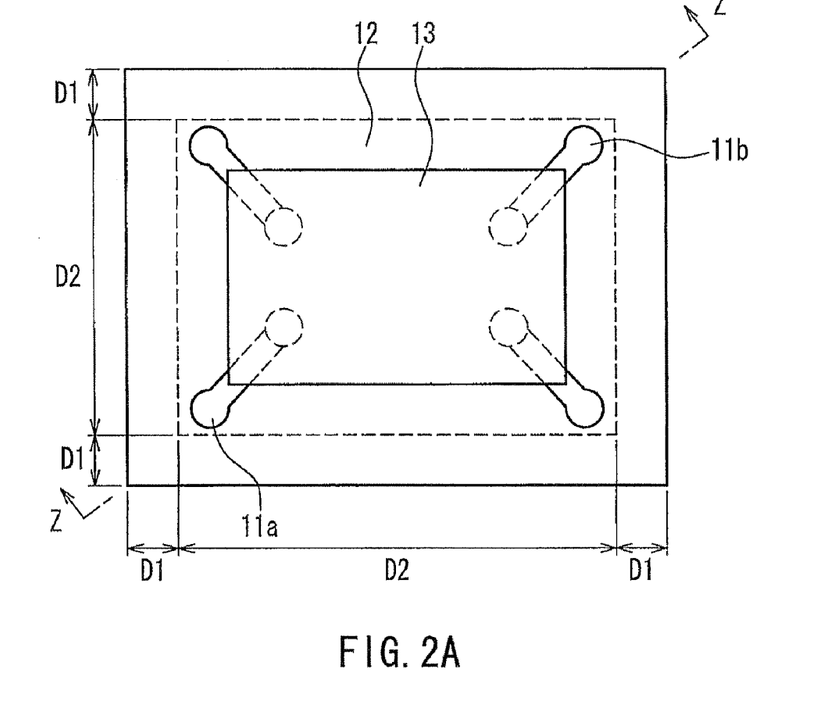
FIG. 2A is a plan view of a package.
Figure 2B:
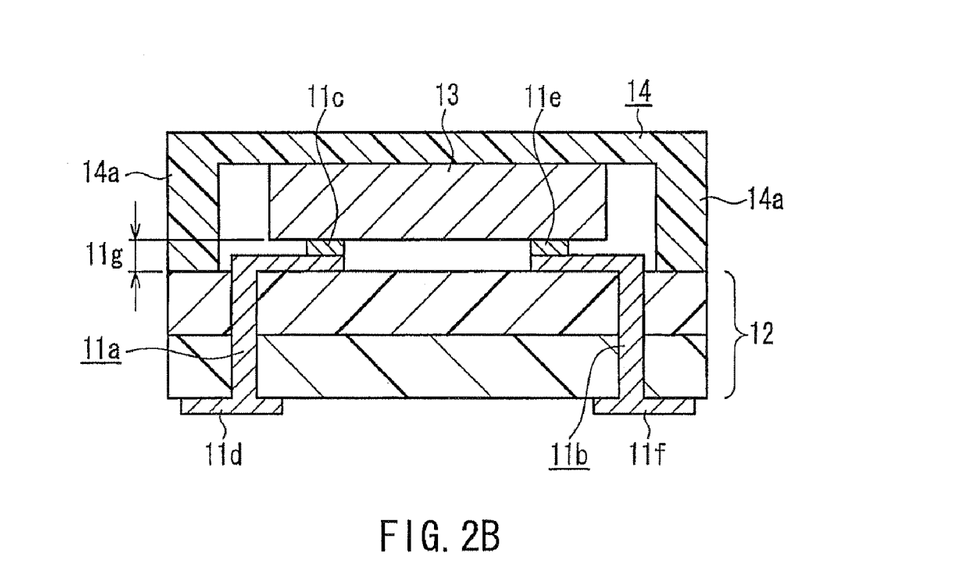
FIG. 2B is a cross-sectional view taken along a line Z-Z in FIG. 2A.

FIG. 2A is a plan view of a package substrate on which an acoustic wave filter element is mounted. FIG. 2B is a cross-sectional view taken along a line Z-Z in FIG. 2A. The package substrate 12 is formed of a laminate of multiple layers of insulation substrates. Electric lines 11*a* and 11*b* are arranged through the package substrate 12, with ends on one side being exposed on a top face of the package substrate 12 (connection terminals 11*c* and 11*e*), ends on the other side being exposed on a back face of the package substrate 12 (ground terminals 11*d* and 11*f*). The acoustic wave filter element 13 is connected with the connection terminals 11*c* and 11*e* by flip-chip bonding. The acoustic wave filter element 13 is sealed with a cap 14. Here, it is in a metal layer on a surface on which the acoustic wave filter element 13 is mounted, i.e., an outermost metal layer 11*g*, that there is a high possibility that the electric lines 11*a* and 11*b* are arranged most closely. The following is the reason: as illustrated in FIG. 2A, the acoustic wave filter element 13 is sealed with the cap 14, and this causes a line arrangement area D2 is narrowed for a wall thickness D1 of the cap 14 in the outermost metal layer 11*g*. If distances between electric lines are decreased in the outermost metal layer 11*g*, the possibility that electric fields generated at the electric lines 11*a* and 11*b* are coupled unnecessarily increases, thereby sometimes degrading the suppression or the isolation. It should be noted that the electric lines 11*a* and 11*b* are not subjected to the constraints of the wall thickness of the cap 14 in any metal layer other than the outermost metal layer 11*g*. The "mounting" in the present specification refers to, not only the state in which various types of elements such as an acoustic wave filter are connected electrically and bonded mechanically to a substrate by soldering or the like, but also a state in which they are bonded mechanically by an adhesive or the like.

It should be noted that the cap 14 may be formed of the package substrate 12 having a cavity, with portions equivalent to side walls 14*a* of the cap 14 being integrated with the package substrate 12. Further, the cap 14 may be formed into a rounded structure, by using a resin sealing technique or the like. Even if such a structure is adopted, the line arrangement area D2 in the outermost metal layer 11*g* narrows in the event, which causes an increase in the possibility that the electric fields generated at the electric lines 11*a* and 11*b* are coupled unnecessarily.

Figure 3A:
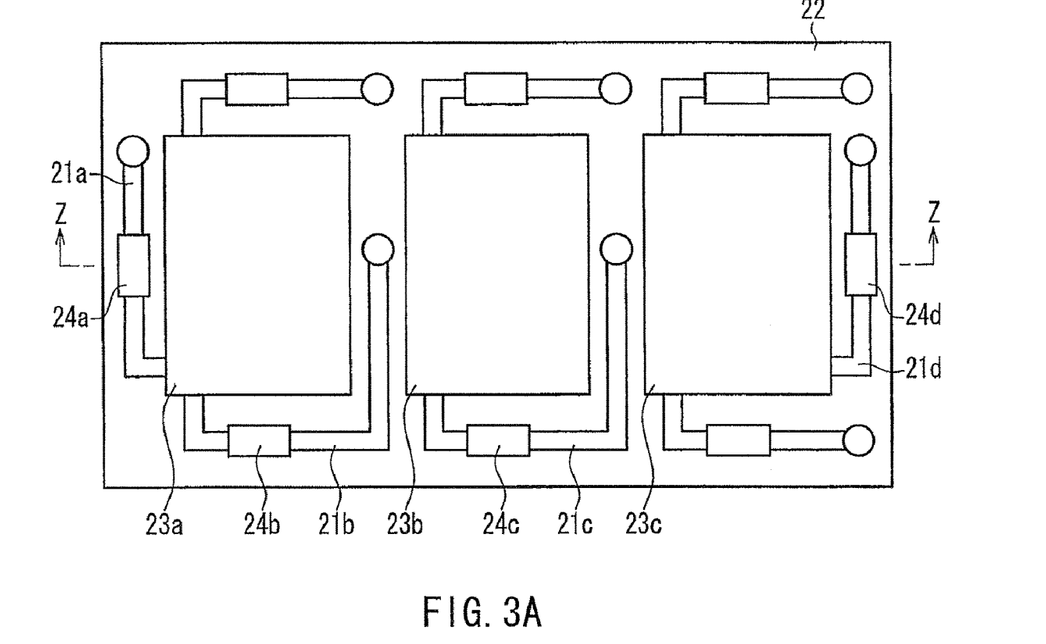
FIG. 3A is a plan view of a module substrate.
Figure 3B:
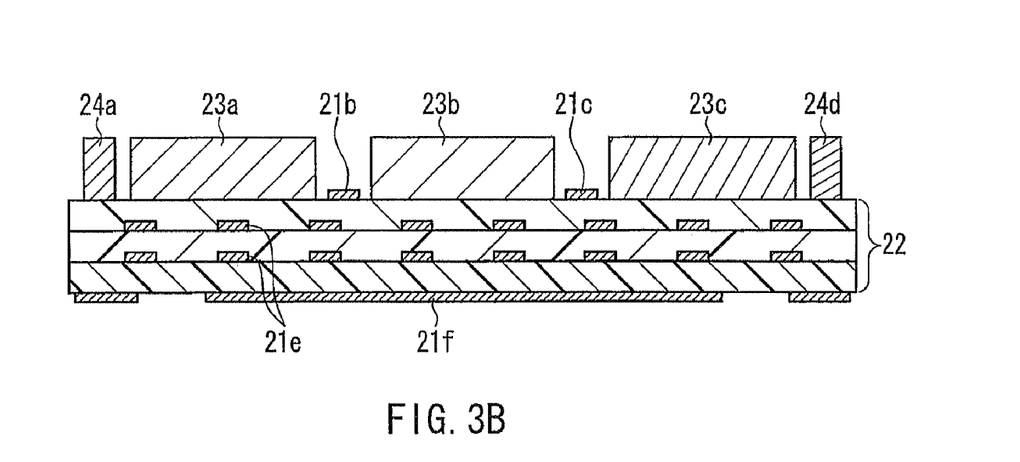
FIG. 3B is a cross-sectional view taken along a line Z-Z in FIG. 3A.

FIG. 3A is a plan view of a communication module in which acoustic wave filter elements are incorporated. FIG. 3B is a cross-sectional view taken along a line Z-Z in FIG. 3A. Electric lines 21*a*, 21*b*, 21*c*, and 21*d* are arranged on a surface of a package substrate 22 (component-mounted surface). The package substrate 22 is formed of a laminate of a plurality of insulation substrates, and on each interface between the insulation substrates, electric lines 21*e* are arranged. On a back face of the package substrate 22, ground terminals 21*f* is provided. The electric lines 21*a*, 21*b*, 21*c*, 21*d*, 21*e*, and the ground terminal 21*f* are connected electrically via electric lines (not illustrated) passing through the package substrate 22, though this is not illustrated in the drawing. Acoustic wave filter elements 23*a*, 23*b*, and 23*c* are mounted on a top face of the package substrate 22, and are connected electrically with the electric lines 21a to 21d, respectively. The electric lines 21a to 21d are connected electrically with chip components 24a to 24d, respectively. The chip components 24a to 24d are coils and capacitors. As illustrated in FIG. 3A, the outermost metal layer (wires 21a to 21d and the like formed on the component-mounted surface of the package substrate 22) has a line arrangement area reduced for the areas of the mounted components on the surface (component-mounted surface) of the package substrate 22. Therefore, as compared with the other metal layers, problems of closer-arranged electric lines are overwhelmingly likely to occur, which increases the possibility that electric fields generated at the electric lines 11a and 11b are coupled unnecessarily. Accordingly, sometimes the suppression degrades as to the acoustic wave filter elements and the isolation degrades as to the duplexers.

As described above, in the communication module having acoustic wave filter elements, spaces between electric lines become narrowest in the outermost metal layer of each of the package and module substrates, whereby unnecessary electromagnetic coupling tends to occur. In other words, it is important to suppress the electromagnetic coupling between electric lines in the outermost metal layers of the package substrate and the module substrate so as to realize a small-size module having excellent suppression characteristics and excellent isolation performance.

Figure 4:
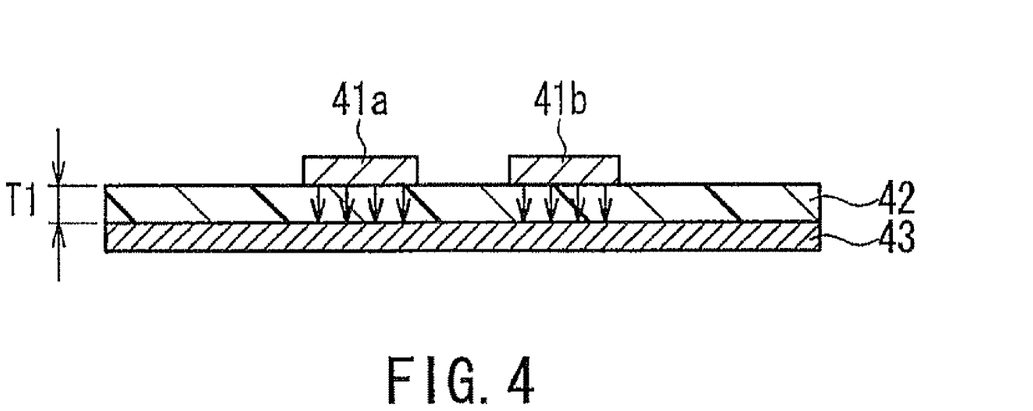
FIG. 4 is a cross-sectional view of a substrate for explaining the concepts of the generation of electric fields radiated from electric lines.

A scheme for suppressing the electromagnetic coupling between electric lines in the outermost metal layer of each of the package substrate and the module substrate is described below. In view of the principle behind the coupling occurring to closely-arranged electric lines illustrated in FIG. 1, a key for the suppression of coupling is to decrease electric fields generated between electric lines, that is, to localize electric fields in a space between each electric line and a ground provided below. A principle for localizing electric fields in a space between each electric line and a ground is illustrated in FIG. 4. FIG. 4 is a cross-sectional view of an insulation substrate 42 having, on its surface, electric lines 41a and 41b (outermost metal layer) made of microstrips. On a back face of the substrate 42, a ground layer 43 is provided. The insulation substrate 42 (outer insulation layer) is interposed between the electric lines 41a and 41b and a ground layer 43. In the configuration illustrated in FIG. 4, the wires 41a and 41b and the ground layer 43 are positioned more closely by decreasing a thickness T1 of the insulation substrate 42. This makes it possible to preferentially lead electric fields generated at the electric lines 41a and 41b to the ground, as indicated by arrows illustrated in FIG. 4, thereby preventing electric fields from being generated easily between the electric lines 41a and 41b. Therefore, unnecessary electromagnetic coupling between the electric lines 41a and 41b can be reduced, whereby the suppression by the acoustic wave filter element and the isolation by the duplexer can be improved. Incidentally, in FIG. 4, the ground layer 43 is provided on the back face of the insulation substrate 43, but any configuration may be adopted as long as a potential difference can be provided at least between the ground layer 43 and the electric lines 41a and 41b.

2. Specific Configuration of Communication Module

Based on the principle illustrated in FIG. 4, the realization of a small-size module having excellent suppression characteristics and excellent isolation performance is described below. A module incorporating acoustic wave filter elements or duplexers is requested to have a smaller thickness. Therefore, the thinning of a package for acoustic wave filters and a module substrate is also requested. From the viewpoint of the strength of the package itself and the module substrate itself, however, they require some thicknesses. In view of these, each of the package substrate and the module substrate preferably is formed of, not a substrate formed of a single insulation layer as illustrated in FIG. 4, but a multilayer substrate having a plurality of insulation layers.

Figure 5A:
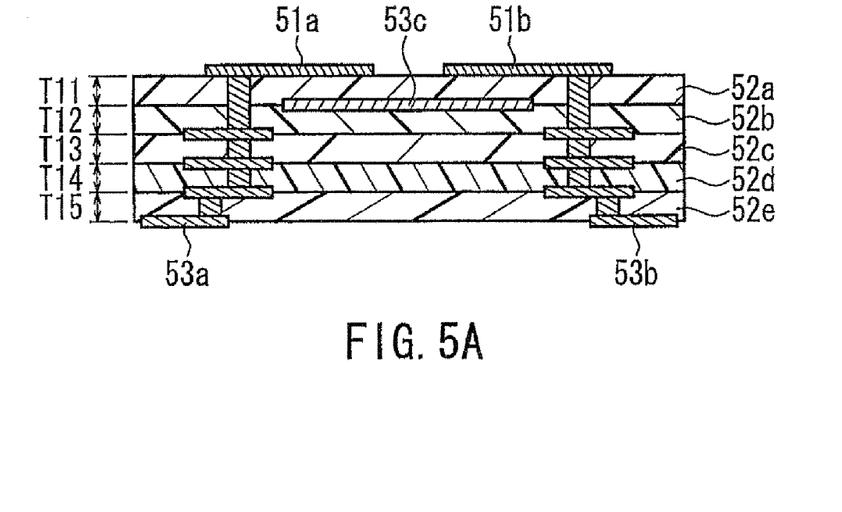
FIG. 5A is a cross-sectional view of a multilayer substrate formed of a laminate of a multiplicity of insulation layers.
Figure 5B:
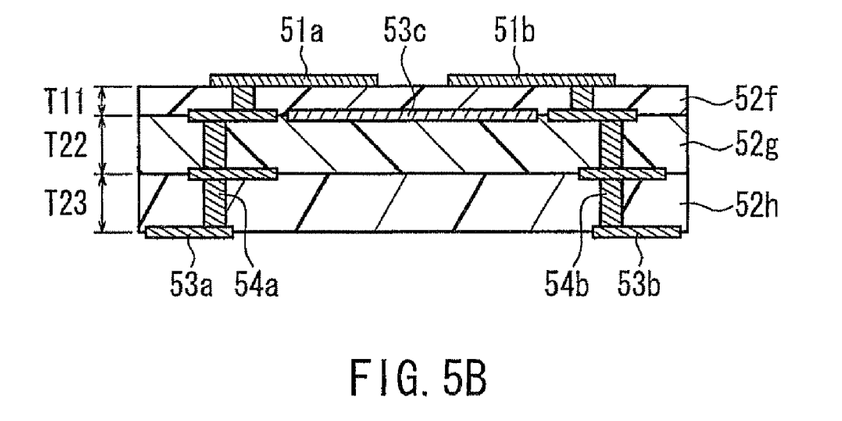
FIG. 5B is a cross-sectional view of a multilayer substrate in which an outer insulation layer is thinner than any of the other insulation layer.

FIG. 5A is a cross-sectional view of a multilayer substrate formed by laminating, in addition to an outer insulation layer 52a (thickness: T11), insulation layers 52b to 52e having the same thickness each (thicknesses: T12 to T15). FIG. 5B is a cross-sectional view of a multilayer substrate formed by laminating, on an outer insulation layer 52f having a thickness T21, insulation layers 52g and 52h each of which has a thickness greater than T21 (thicknesses: T22, T23). The entire thickness of the multilayer substrate illustrated in FIG. 5A (sum of T11 to T15) and the entire thickness of the multilayer substrate illustrated in FIG. 5B (sum of T21 to T23) are equal to each other. On top faces of the outer insulation layers 52a and 52f, electric lines 51a and 51b are provided. On back faces of the insulation layer 52e and 52h, footpad layers 53a and 53b are provided. The electric line 51a and the footpad layer 53a are connected electrically via an internal electric line 54a. The electric line 51b and the footpad layer 53b are connected electrically via an internal electric line 54b. Between the outer insulation layer 52a and the insulation layer 52b, a ground layer 53c is provided. Between the outer insulation layer 52f and the insulation layer 52g, a ground layer 53c is provided.

First of all, since the multilayer substrate illustrated in FIG. 5A includes many insulation layers, many laminating steps are required in the production, which leads to an increase in the costs. Further, the handling of a thin insulation layer in the production process is more difficult than the handling of a thick insulation layer, and hence, laminate displacement tends to occur. On the other hand, the multilayer substrate illustrated in FIG. 5B requires fewer laminating steps in the production since the number of insulation layers is smaller, which allows the costs to be reduced, as compared with the case of the multilayer substrate illustrated in FIG. 5A. Further, since each thickness of the insulation layers 52g and 52h is greater than the thickness of the insulation layer 52f in the multilayer substrate illustrated in FIG. 5B, the handling in the production process is made easier, which makes laminate displacement hardly occur. Therefore, the multilayer substrate illustrated in FIG. 5B is superior to the multilayer substrate illustrated in FIG. 5A regarding the cost performance and the producibility.

Figure 6A:
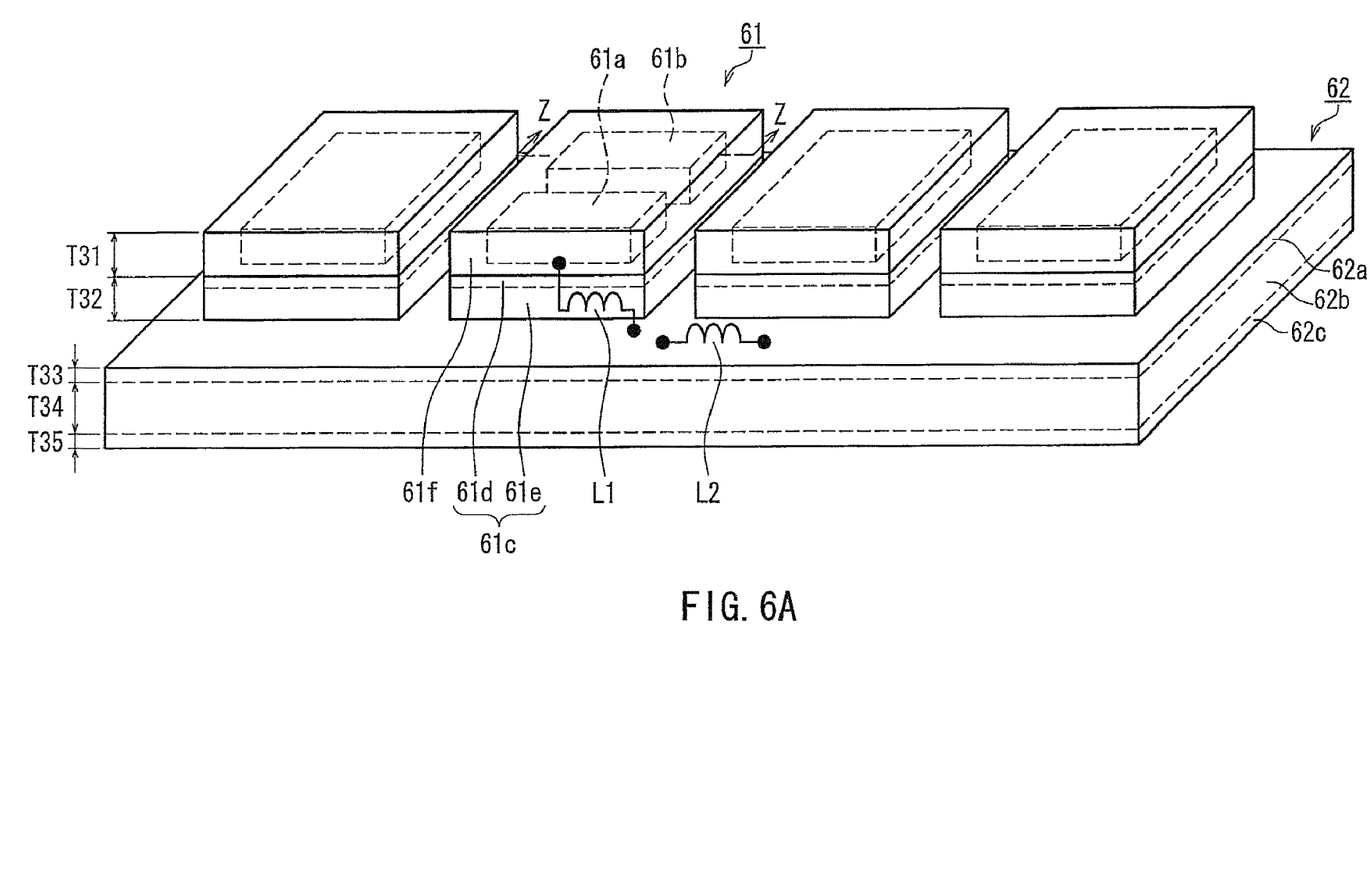
FIG. 6A is a perspective view of a module substrate according to the present embodiment.
Figure 6B:
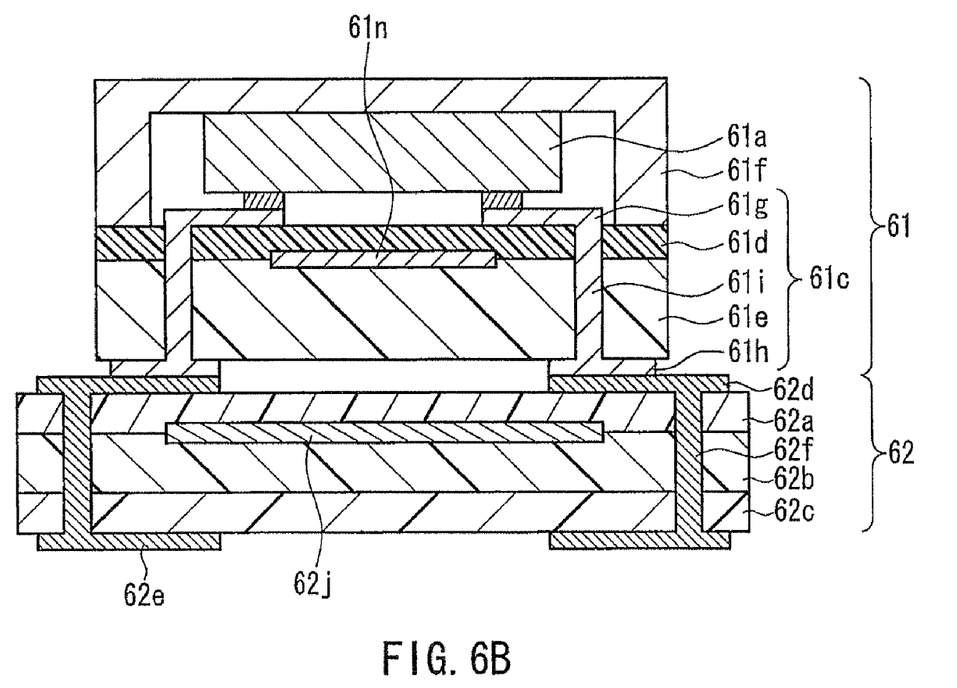
FIG. 6B is a cross-sectional view taken along a line Z-Z in FIG. 6A.

FIG. 6A is a perspective view of a communication module having a configuration in which a plurality of duplexers each of which includes elastic surface wave filter elements are mounted on one module substrate. FIG. 6B is a cross-sectional view taken along a line Z-Z in FIG. 6A. The communication module illustrated in FIG. 6A includes a plurality of duplexers 61 on a top face of a module substrate 62. Each of the duplexers 61 includes a plurality of elastic surface wave filter elements 61a and 61b on a package substrate 61c. The elastic surface wave filter elements 61a and 61b are covered with a metal cap 61f. The package substrate 61c is formed of a laminate of a plurality of insulation layers. An outer insulation layer 61d included in the package substrate 61c has a thickness T31 smaller than a thickness T32 of the other insulation layer 61e. The module substrate 62 is formed of a laminate of a plurality of insulation layers. An outer insulation layer 62a included in the module substrate 62 has a thickness T33 smaller than a thickness T34 and a thickness T35 of the other insulation layers 62b and 62c, respectively. As illustrated in FIG. 6B, the package substrate 61c includes an electric line 61g on its top face, and a footpad layer 61h on its back face. The electric line 61g and the footpad layer 61h are connected electrically with each other via an internal electric line 61i. The elastic surface wave filter element 61a is connected electrically with the electric line 61g. The module substrate 62 includes an electric line 62d on its top face, and a ground layer 62e on its back face. The electric line 62d and the ground layer 62e are connected electrically with each other via an internal electric line 62f. The electric line 62d is connected electrically with the ground layer 61h of the package substrate 61c. A ground layer 61n is provided between the outer insulation layer 61d and the insulation layer 61e. A ground layer 62j is provided between the outer insulation layer 62a and the insulation layer 62b. An inductance L1 is an inductance formed at an electric line in the package substrate 61c. An inductance L2 is an inductance formed at an electric line in the module substrate 62.

In the communication module illustrated in FIGS. 6A and 6B, the distance between the electric line 61g and the ground layer 61n is smaller since the outermost insulation layer 61d of the package substrate 61c is thinner than the other insulation layers. Therefore, electric fields generated around the electric line 61g can be led to the ground layer 61n, whereby the suppression characteristics of the acoustic wave filter can be improved and the isolation characteristics of the duplexer can be improved. Besides, since the outermost insulation layer 62a of the module substrate 62 is thinner than the other insulation layers, the distance between the electric line 62d and the ground layer 62j can be reduced. Therefore, electric fields generated around the electric line 62d can be led to the ground layer 62j. Thus, a communication module having improved suppression characteristics of acoustic wave filters and improved isolation characteristics of duplexers can be provided.

Simulation of characteristics such as isolation was carried out on a certain duplexer 61 in the communication module illustrated in FIGS. 6A and 6B. It should be noted that the characteristics of the elastic surface wave filter elements 61a and 61b were calculated using the mode coupling theory. Overall characteristics including those of the package substrate 61c, the metal cap 61f, and the module substrate 62 were calculated using three-dimensional electromagnetic field analysis software. These calculation methods have sufficient precision for the verification of the effects of the present embodiment.

2-1. Example 1

Figure 7:
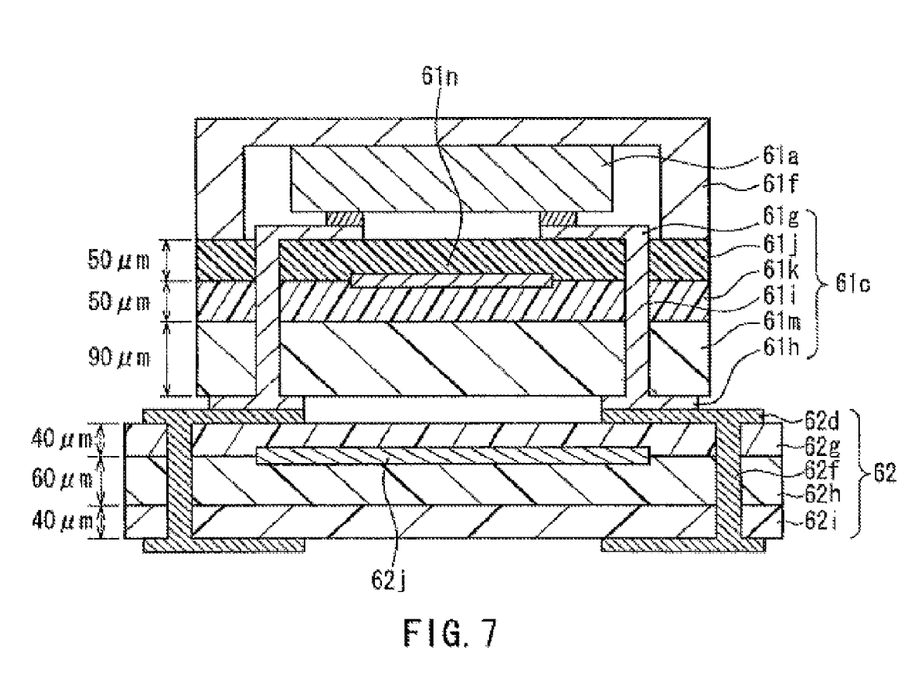
FIG. 7 is a cross-sectional view of a module substrate according to Example 1.

FIG. 7 is a cross-sectional view illustrating the acoustic wave duplexer of Example 1 used in the characteristics simulation. A Band 1 duplexer (transmission band: 1920 to 1980 MHz, reception band: 2110 to 2170 MHz) of a W-CDMA (Wideband Code Division Multiple Access) type portable telephone was designed as an acoustic wave duplexer. An acoustic wave filter element was an elastic surface wave filter produced using a LiTaO$_3$ substrate. A package substrate 61c for mounting filters was formed of alumina ceramics, and was sealed with a metal cap 61f. A module substrate 62 was a build-up substrate in which FR4 (FR: flame retardant) was used as a resin material (relative dielectric constant: 4.8). A package substrate 61c was formed of a laminate of the following three layers of alumina-ceramics insulators having the following thicknesses: an outer insulation layer 61j having a thickness of 50 μm; an intermediate insulation layer 61k having a thickness of 50 μm; and a lowermost insulation layer 61m having a thickness of 90 μm. Thus, the outer insulation layer 61j was thinner than each of the other layers. The module substrate 62 was formed of a laminate of the following three layers of insulators having the following thicknesses: an outer insulation layer 62g having a thickness of 40 μm; an intermediate insulation layer 62h having a thickness of 60 μm; and a lowermost insulation layer 62i having a thickness of 40 μm.

It should be noted that Example 1 had a configuration such that the thickness of the outer insulation layer 61j of the package substrate 61c was smaller than the thickness of any of the other insulation layers, but alternatively the configuration may be such that the outer insulation layer 61j has a relative dielectric constant smaller than that of any of the other insulation layers. With such a configuration, an increase in a capacity caused by a decrease in the distance between the electric line provided on the outer insulation layer 61j and the ground layer provided under the outer insulation layer 61j can be reduced, whereby excellent characteristics can be achieved. Further, Example 1 had a configuration such that the outer insulation layer 62g in the module substrate had a thickness smaller than the thickness of any of the other insulation layers, but alternatively, it may have a configuration such that the outer insulation layer 62g has a relative dielectric constant smaller than that of any of the other insulation layers. With such a configuration, an increase in a capacity caused by a decrease in the distance between the electric line provided on the outer insulation layer 62g and the ground layer provided under the outer insulation layer 62g can be reduced, whereby excellent characteristics can be achieved. Examples of the material for the outer insulation layer 61j of the package substrate 61c and the outer insulation layer 62g of the module substrate 62 include a fluorocarbon resin substrate (relative dielectric constant: 2.2), a glass fluorocarbon resin substrate (relative dielectric constant: 2.6), a polyimide substrate (relative dielectric constant: 2.9 to 3.0), and a thermosetting resin substrate made of a bis maleimide triazine resin or the like (relative dielectric constant: 3.3). Each insulation layer other than the outer insulation layer is thus formed by FR4 (relative dielectric constant: 4.8), whereby the relative dielectric constant of the outer insulation layer can be made smaller than a relative dielectric constant of any of the other insulation layers. It should be noted that the above-described substrate materials and relative dielectric constants are merely illustrative, and the present invention should not be limited by these materials and relative dielectric constants. Further, the above-described substrate materials and relative dielectric constants are mentioned as those for the package substrate and the module substrate of Example 1, but can be applied to the package substrates and the module substrates of the other examples and embodiments.

Figure 8:
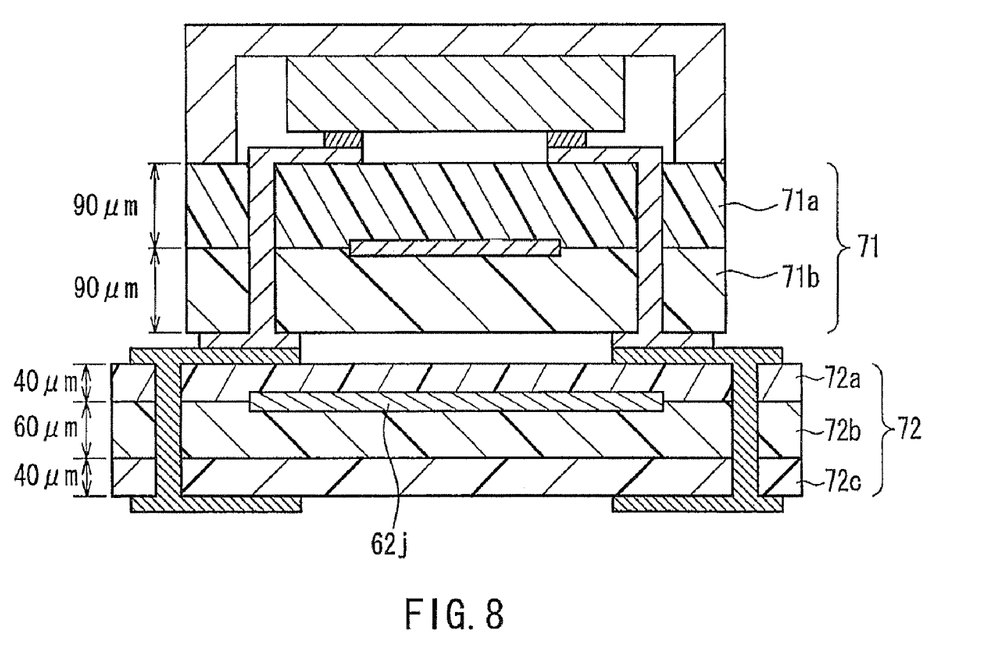
FIG. 8 is a cross-sectional view of a module substrate according to Comparative Example.

FIG. 8 is a comparative example of an acoustic wave duplexer. A substrate structure in the acoustic wave duplexer illustrated in FIG. 8 is, for example, the same as the structure of the substrate disclosed in JP 2008-271421 A. Since the members other than the package substrate 61c and the module substrate 62 illustrated in FIG. 7 had configurations identical to those in FIG. 8, the designation of the same by the reference numerals and detailed descriptions of the same are omitted. A package substrate 71 was formed of a laminate of two layers of alumina ceramics insulators, in which an outer insulation layer 71a and a lowermost insulation layer 71b had the same thickness (90 μm each). A module substrate 72 was formed of a laminate of the following three layers of resin-made insulators having the following thicknesses: an outer insulation layer 72a having a thickness of 40 μm; an intermediate insulation layer 72b having a thickness of 60 μm; and a lowermost insulation layer 72c having a thickness of 40 μm.

Figure 9:
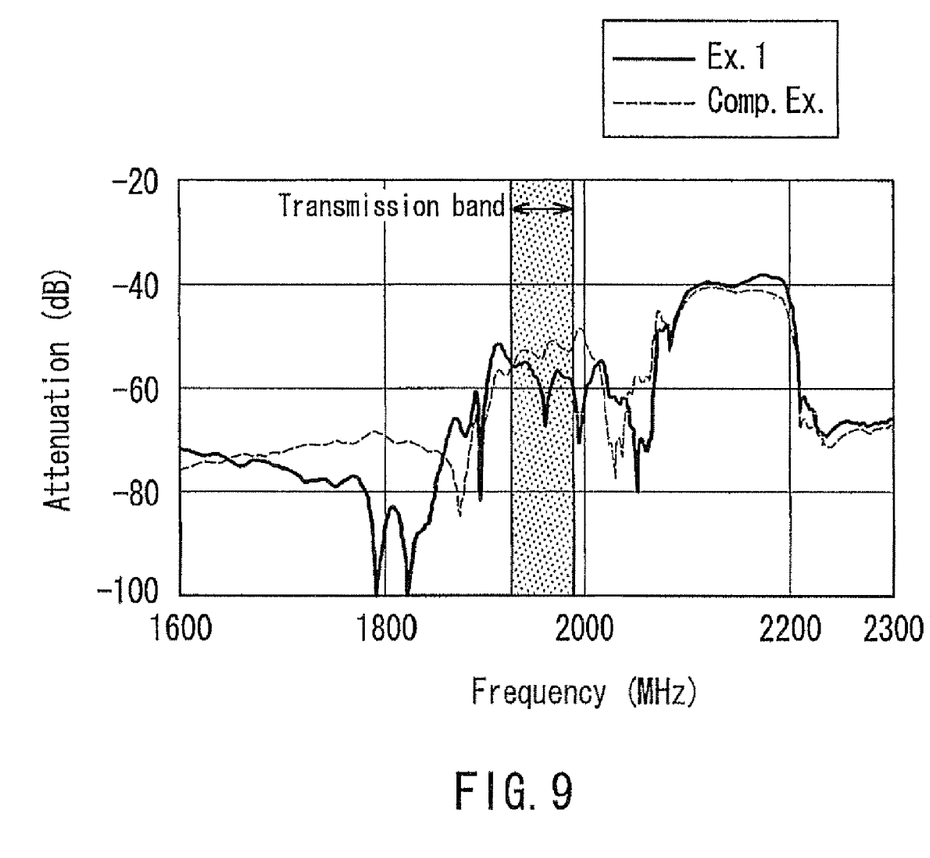
FIG. 9 is a characteristics diagram illustrating frequency characteristics of a duplexer according to Example 1 and frequency characteristics of a duplexer according to Comparative Example.

FIG. 9 illustrates results of calculation of isolation characteristics. In FIG. 9, a solid line indicates a calculation result of isolation characteristics of the acoustic wave duplexer (Example 1) illustrated in FIG. 7, and a broken line indicates a calculation result of isolation characteristics of the acoustic wave duplexer (Comparative Example) illustrated in FIG. 8. It was confirmed that with the acoustic wave duplexer according to Example 1, the isolation of the transmission band, which is the most important, was improved by at most 10 dB or more, as compared with Comparative Example, as illustrated in FIG. 9.

On the other hand, in the acoustic wave duplexer of Comparative Example illustrated in FIG. 8, the outer insulation layer 72a of the module substrate 72 had a smaller thickness than that of any of the other insulation layers, while the outer insulation layer 71a of the package substrate 71 had the same thickness as that of the other insulation layer. Therefore, the isolation characteristics impaired significantly, as compared with the acoustic wave duplexer of Example 1. Thus, the isolation characteristics can be improved by decreasing the thickness of the outer insulation layer as compared with the thickness of any of the other insulation layers, not in the module substrate alone, but in both of the module substrate and the package substrate.

2-2. Example 2

Figure 10:
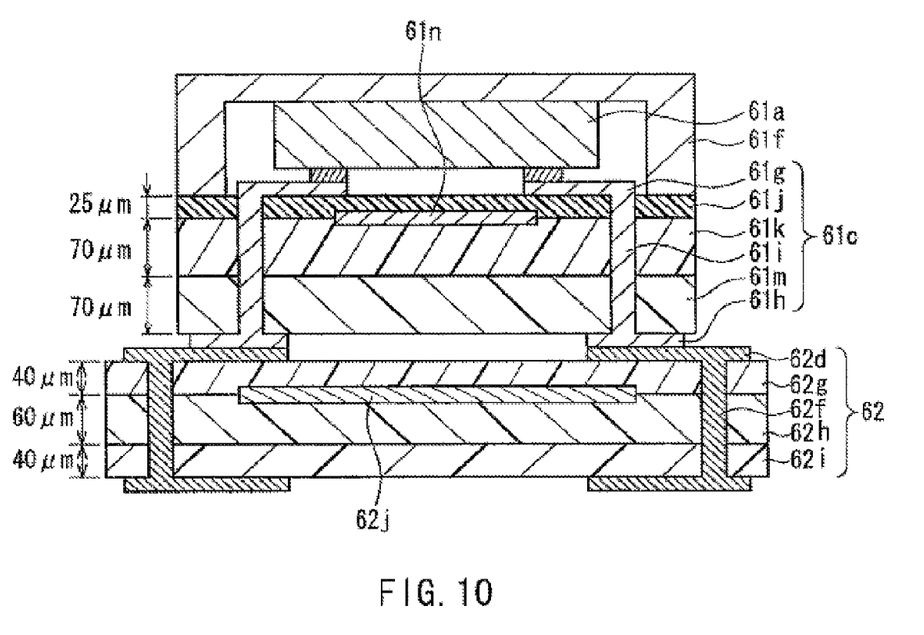
FIG. 10 is a cross-sectional view of a module substrate according to Example 2.

FIG. 10 is a cross-sectional view illustrating an acoustic wave duplexer of Example 2 used in the characteristics simulation. In FIG. 10, the members having the same configurations as those in the acoustic wave duplexer illustrated in FIG. 7 are designated by the same reference numerals, and detailed descriptions of the same are omitted. In the acoustic wave duplexer illustrated in FIG. 10, the following points are different from those of the acoustic wave duplexer illustrated in FIG. 7: an outer insulation layer 61j in a package substrate 61c had a thickness of 25 µm; an intermediate insulation layer 61k had a thickness of 70 µm; and a lowermost insulation layer 61m had a thickness of 70 µm. In a module substrate 62, an outer insulation layer 62g had a thickness of 40 µm, an intermediate insulation layer 62h had a thickness of 60 µm, and a lowermost insulation layer 62i had a thickness of 40 µm, like those of the acoustic wave duplexer of Example 1. The acoustic wave duplexer of Example 2 was characterized in that the thickness of the outer insulation layer 61j of the package substrate 61c was smaller than the thickness of the outer insulation layer 62g of the module substrate 62.

Figure 11:
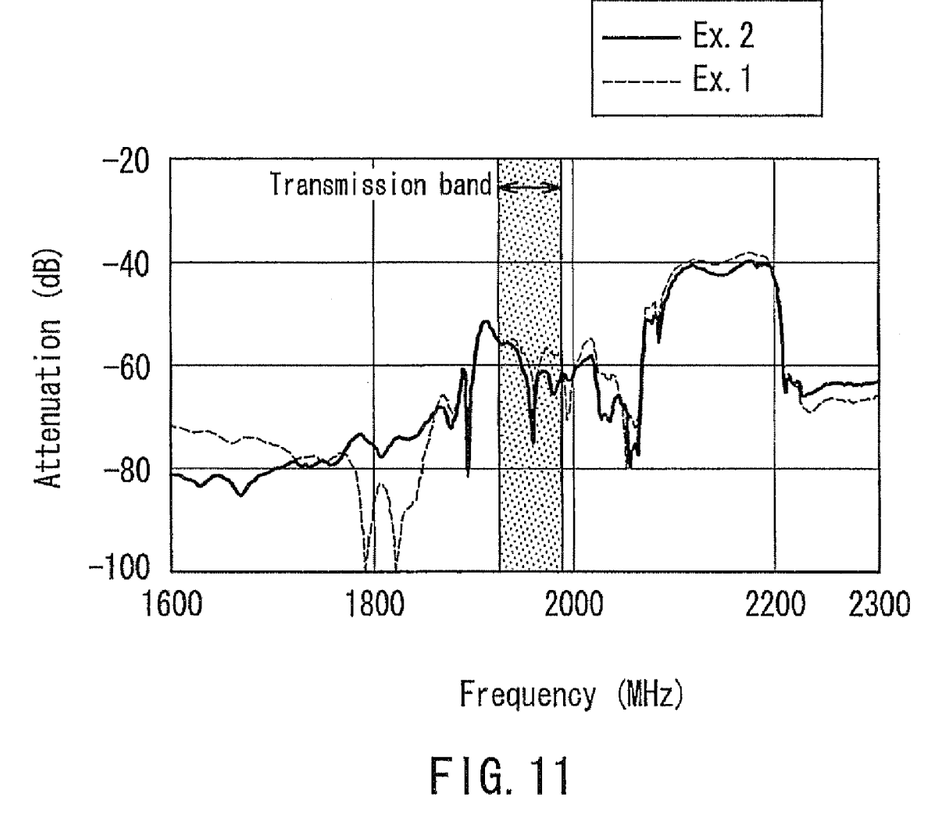
FIG. 11 is a characteristics diagram illustrating frequency characteristics of duplexers according to Examples 1 and 2.

FIG. 11 illustrates results of calculation of isolation characteristics of the acoustic wave duplexer illustrated in FIG. 10. In FIG. 11, a solid line indicates a calculation result of isolation characteristics of the acoustic wave duplexer according to Example 2, and a broken line indicates a calculation result of isolation characteristics of the acoustic wave duplexer according to Example 1. It was confirmed that, as illustrated in FIG. 11, with the acoustic wave duplexer according to Example 2, the isolation of the transmission band, which is the most important, was improved by at most 5 dB or more.

3. Effects of Embodiment, and Others

The present embodiment makes it possible to suppress unnecessary electromagnetic coupling between electric lines in a package incorporating acoustic wave filter elements, and unnecessary electromagnetic coupling between electric lines in a module substrate incorporating a plurality of acoustic wave filters and duplexers. Therefore, this makes it possible to realize a communication module having excellent suppression characteristics and isolation performance.

Further, each of outer insulation layers in a package substrate and a module substrate formed of multilayer laminates of insulation layers, respectively, is made thinner than the other insulation layer, whereby each substrate can be made thinner. Accordingly, a communication module can be downsized.

Still further, according to the present embodiment, only the outer insulation layer in the substrate is made thinner than the other insulation layer, whereby the number of the insulation layers can be decreased. Therefore, the number of steps for laminating the insulation layers in the production of the substrate can be decreased, whereby the costs can be reduced. Besides, since the insulation layers other than the outer insulation layer have thicknesses greater than the thickness of the outer insulation layer, the handling is made easier in the production process, and this makes laminate displacement hardly occur. Therefore, the present embodiment provides excellent producibility.

Still further, according to the present embodiment, the relative dielectric constant of the outer insulation layer of the package substrate is set at a lower level or the same level as compared with the relative dielectric constant of any of the other insulation layers included in the package substrate. With this configuration, an increase in a capacity caused by a decrease in the distance between an outermost electric line and a ground in the package can be reduced, whereby excellent characteristics can be achieved.

Still further, according to the present embodiment, the relative dielectric constant of the outer insulation layer of the module substrate is set at a lower level or the same level as compared with the relative dielectric constant of any of the other insulation layers included in the module substrate. With this configuration, an increase in a capacity caused by a decrease in the distance between an outermost electric line and a ground in the package can be reduced, whereby excellent characteristics can be achieved.

Still further, according to the present embodiment, a coil is mounted on the module substrate. This makes it possible to compensate, with the coil, an increase in a stray capacitance caused by a decrease in the thickness of the outer insulation layer in each of the package substrate and the module substrate, whereby further excellent characteristics can be achieved.

Still further, according to the present embodiment, electric lines for forming inductances are provided in the package for housing acoustic wave filter elements. With this configuration, the number of coils mounted on the module substrate can be decreased, whereby a further downsized communication module can be realized.

Still further, according to the present embodiment, electric lines for forming inductances are provided in the module substrate. With this configuration, the number of coils mounted on the module substrate can be decreased, whereby a further downsized communication module can be realized.

It should be noted that the elastic surface wave filter element 61a in the present embodiment is an exemplary filter element of the present invention. As the filter element of the present invention, a filter element of various types is applicable, not only the elastic surface wave filter element, but also elastic boundary wave filter element. The package substrate 61c according to the present embodiment is an exemplary package substrate of the present invention. The module substrate 62 according to the present embodiment is an exemplary module substrate of the present invention. The outer insulation layer 61d according to the present embodiment is an exemplary outer insulation layer of the package substrate of the present invention. The outermost insulation layer 62*a* according to the present embodiment is an exemplary outer insulation layer of the module substrate of the present invention.

The disclosure of the present application is useful for a communication module used in mobile communication and radio communication, such as a portable telephone, a PHS (personal handy-phone system), wireless LAN (local area network).

The following notes are disclosed regarding the present embodiment.

[Note 1]

A communication module comprising:

a filter element;

a package substrate on which the filter element is mounted; and a module substrate on which the package substrate is mounted, wherein each of the package substrate and the module substrate is formed of a laminate of a plurality of metal layers and a plurality of insulation layers, wherein an outermost insulation layer forming a mounting surface of the package substrate that is a surface on which the filter element is mounted has a thickness smaller than a thickness of at least one of the other insulation layers included in the package substrate, and an outer insulation layer forming a mounting surface of the module substrate that is a surface on which the package substrate is mounted has a thickness smaller than a thickness of at least one of the other insulation layers included in the module substrate.

[Note 2]

The communication module according to Note 1, wherein the outer insulation layer of the package substrate has a thickness smaller than that of the outer insulation layer of the module substrate.

[Note 3]

The communication module according to Note 1, wherein a ground pattern is provided on a back face of the package substrate, the back face being opposite to the mounting surface of the outer insulation layer of the package substrate.

[Note 4]

The communication module according to Note 3, wherein the mounting surface of the package substrate has a surface electric line connected with the filter element, and the ground pattern overlaps the surface electric line.

[Note 5]

The communication module according to Note 4, wherein, in the case where the surface electric line is a signal line, a portion of the signal line opposed to another surface electric line overlaps the ground pattern.

[Note 6]

The communication module according to Note 4, wherein, in the case where the surface electric line is a ground line, the ground line overlaps the ground pattern.

[Note 7]

The communication module according to Note 4 wherein the ground pattern has a portion that overlaps an internal portion of the surface electric line arranged in a region where the filter element is mounted.

[Note 8]

The communication module according to Note 1, wherein a ground pattern is provided on a back face of the module substrate, the back face being opposite to the mounting surface of the outer insulation layer of the module substrate.

[Note 9]

The communication module according to Note 8, wherein the mounting surface of the module substrate has a surface electric line connected with the package substrate, and the ground pattern overlaps the surface electric line.

[Note 10]

The communication module according to Note 9, wherein, in the case where the surface electric line is a signal line, a portion of the signal line opposed to another surface electric line overlaps the ground pattern.

[Note 11]

The communication module according to Note 9, wherein, in the case where the surface electric line is a ground line, the ground line overlaps the ground pattern.

[Note 12]

The communication module according to Note 9, wherein the ground pattern has a portion that overlaps an internal portion of the surface electric line arranged in a region where package substrate is mounted.

[Note 13]

The communication module according to Note 1, wherein the outer insulation layer of the package substrate has a thickness smaller than, or identical to, any of all the other insulation layers included in the package substrate.

[Note 14]

The communication module according to Note 1, wherein the outer insulation layer of the module substrate has a thickness smaller than, or identical to, any of all the other insulation layers included in the module substrate.

[Note 15]

The communication module according to Note 1, wherein the outer insulation layer of the package substrate has a relative dielectric constant smaller than, or identical to, a relative dielectric constant of another insulation layer included in the package substrate.

[Note 16]

The communication module according to Note 1, wherein the outer insulation layer of the module substrate has a relative dielectric constant smaller than, or identical to, a relative dielectric constant of another insulation layer included in the module substrate.

[Note 17]

The communication module according to Note 1, wherein a coil is mounted on the module substrate.

[Note 18]

The communication module according to Note 1, wherein an electric line for forming an inductance is included in a package for housing the filter element.

[Note 19]

The communication module according to Note 1, wherein an electric line for forming an inductance is included in the module substrate.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A communication module comprising:
   a filter element;
   a package substrate on which the filter element is mounted; and
   a module substrate on which the package substrate is mounted,
   wherein each of the package substrate and the module substrate is formed of a laminate of a plurality of metal layers and a plurality of insulation layers,
   wherein an outer insulation layer forming a mounting surface of the package substrate that is a surface on which the filter element is mounted has a thickness smaller than a thickness of at least one of the other insulation layers included in the package substrate,
   wherein an outer insulation layer forming a mounting surface of the module substrate that is a surface on which the package substrate is mounted has a thickness smaller than a thickness of at least one of the other insulation layers included in the module substrate, and
   wherein said outer insulation layer of the package substrate is thinner than said outer insulation layer of the module substrate.

2. The communication module according to claim 1, wherein a ground pattern is provided on a back face of the package substrate, the back face being opposite to the mounting surface of the outer insulation layer of the package substrate.

3. The communication module according to claim 1, wherein a ground pattern is provided on a back face of the module substrate, the back face being opposite to the mounting surface of the outer insulation layer of the module substrate.

4. The communication module according to claim 2, wherein a ground pattern is provided on a back face of the module substrate, the back face being opposite to the mounting surface of the outer insulation layer of the module substrate.

5. The communication module according to claim 1, wherein the outer insulation layer of the package substrate has a relative dielectric constant smaller than, or identical to, a relative dielectric constant of another insulation layer included in the package substrate.

6. The communication module according to claim 1, wherein the outer insulation layer of the module substrate has a relative dielectric constant smaller than, or identical to, a relative dielectric constant of another insulation layer included in the module substrate.

* * * * *